(12) United States Patent
Jain et al.

(10) Patent No.: US 10,109,716 B2
(45) Date of Patent: Oct. 23, 2018

(54) TURNABLE BREAKDOWN VOLTAGE RF FET DEVICES

(71) Applicant: INTERNATIONAL BUSINESS MACHINES CORPORATION, Armonk, NY (US)

(72) Inventors: Vibhor Jain, Essex Junction, VT (US); Qizhi Liu, Lexington, MA (US); John J. Pekarik, Underhill, VT (US)

(73) Assignee: INTERNATIONAL BUSINESS MACHINES CORPORATION, Armonk, NY (US)

( * ) Notice: Subject to any disclaimer, the term of this patent is extended or adjusted under 35 U.S.C. 154(b) by 0 days.

(21) Appl. No.: 14/864,020

(22) Filed: Sep. 24, 2015

(65) Prior Publication Data
US 2016/0013290 A1    Jan. 14, 2016

Related U.S. Application Data

(62) Division of application No. 14/300,884, filed on Jun. 10, 2014.

(51) Int. Cl.
*H01L 29/417* (2006.01)
*H01L 29/78* (2006.01)
(Continued)

(52) U.S. Cl.
CPC .. *H01L 29/41775* (2013.01); *H01L 21/28052* (2013.01); *H01L 29/665* (2013.01);
(Continued)

(58) Field of Classification Search
CPC ........... H01L 29/66848; H01L 29/7832; H01L 2924/13063; H01L 29/0611;
(Continued)

(56) References Cited

U.S. PATENT DOCUMENTS 4,566,021 A    1/1986 Yokoyama
4,745,086 A    5/1988 Parrillo et al.
(Continued)

FOREIGN PATENT DOCUMENTS

KR    1020050065172 A    6/2005
KR    100850091 B1    7/2008
KR    101044775 B1 *    6/2011    ........... H01L 21/336

OTHER PUBLICATIONS

KR 101044775 B1—machine translation.*
(Continued)

*Primary Examiner* — Brett Feeney
*Assistant Examiner* — Vincent Wall
(74) *Attorney, Agent, or Firm* — Steven Meyers; Andrew M. Calderon; Roberts Mlotkowski Safran Cole & Calderon, P.C.

(57) ABSTRACT

A tunable breakdown voltage RF MESFET and/or MOSFET and methods of manufacture are disclosed. The method includes forming a first line and a second line on an underlying gate dielectric material. The second line has a width tuned to a breakdown voltage. The method further includes forming sidewall spacers on sidewalls of the first and second line such that the space between first and second line is pinched-off by the dielectric spacers. The method further includes forming source and drain regions adjacent outer edges of the first line and the second line, and removing at least the second line to form an opening between the sidewall spacers of the second line and to expose the underlying gate dielectric material. The method further includes depositing a layer of material on the underlying gate dielectric material within the opening, and forming contacts to a gate structure and the source and drain regions.

11 Claims, 6 Drawing Sheets

(51) Int. Cl.
*H01L 29/66* (2006.01)
*H01L 21/28* (2006.01)
*H01L 29/812* (2006.01)
*H01L 27/12* (2006.01)
*H01L 29/51* (2006.01)
*H01L 29/49* (2006.01)
*H01L 29/47* (2006.01)

(52) U.S. Cl.
CPC .. *H01L 29/66659* (2013.01); *H01L 29/66848* (2013.01); *H01L 29/7835* (2013.01); *H01L 29/812* (2013.01); *H01L 27/1203* (2013.01); *H01L 29/47* (2013.01); *H01L 29/4933* (2013.01); *H01L 29/518* (2013.01); *H01L 29/66871* (2013.01); *H01L 2924/0002* (2013.01)

(58) Field of Classification Search
CPC ........... H01L 29/0661; H01L 29/66871; H01L 27/1203; H01L 29/41775; H01L 23/66; H01L 29/4916; H01L 29/518; H01L 29/78; H01L 29/66659; H01L 29/7816; H01L 21/28088; H01L 29/66681; H01L 29/665; H01L 29/4975; H01L 29/45; H01L 29/66; H01L 21/0334; H01L 21/823468; H01L 21/823864; H01L 29/66545; H01L 29/6653; H01L 29/4983; H01L 29/6659; H01L 29/42376; H01L 29/402; H01L 29/7835; H01L 29/66553; H01L 29/6656; H01L 29/66689
See application file for complete search history.

(56) References Cited

U.S. PATENT DOCUMENTS

| | | | |
|---|---|---|---|
| 5,389,807 A | | 2/1995 | Shiga |
| 5,668,024 A * | | 9/1997 | Tsai ................ H01L 21/823807 257/E21.633 |
| 6,005,267 A * | | 12/1999 | Griffin ................ H01L 29/7832 257/270 |
| 6,127,845 A | | 10/2000 | Kolze et al. |
| 6,271,132 B1 * | | 8/2001 | Xiang ............. H01L 21/823814 257/E21.444 |
| 6,312,997 B1 | | 11/2001 | Tran |
| 6,407,435 B1 | | 6/2002 | Ma et al. |
| 6,686,233 B2 | | 2/2004 | Siiderbarg et al. |
| 7,091,118 B1 | | 8/2006 | Pan et al. |
| 7,256,113 B1 | | 8/2007 | Hellig et al. |
| 7,391,083 B2 | | 6/2008 | Kato et al. |
| 7,649,225 B2 | | 1/2010 | Cai et al. |
| 7,663,237 B2 * | | 2/2010 | Peng ................ H01L 21/76895 257/750 |
| 7,732,293 B2 | | 6/2010 | Voldman |
| 8,067,807 B2 | | 11/2011 | Taya |
| 8,076,720 B2 | | 12/2011 | Shimada et al. |
| 8,247,869 B2 | | 8/2012 | Yang et al. |
| 8,390,057 B1 * | | 3/2013 | Zuniga ................ H01L 29/402 257/328 |
| 8,415,763 B2 | | 4/2013 | Harame et al. |
| 8,450,814 B2 | | 5/2013 | Zinn |
| 8,482,054 B2 | | 7/2013 | Sakaguchi |
| 9,455,701 B1 | | 9/2016 | Titus |
| 10,038,063 B2 | | 7/2018 | Jain et al. |
| 2004/0108548 A1 | | 6/2004 | Cai |
| 2005/0064690 A1 * | | 3/2005 | Amos ................ H01L 21/76895 438/592 |
| 2005/0093105 A1 * | | 5/2005 | Yang .............. H01L 21/823807 257/627 |
| 2006/0128151 A1 | | 6/2006 | Ryu |
| 2006/0131676 A1 * | | 6/2006 | Saito ............... H01L 21/823835 257/412 |
| 2008/0182394 A1 * | | 7/2008 | Yang ................ H01L 29/7835 438/510 |
| 2009/0230463 A1 | | 9/2009 | Carter et al. |
| 2011/0034018 A1 | | 2/2011 | Atherton |
| 2011/0136313 A1 * | | 6/2011 | Lee .................. H01L 21/28088 438/299 |
| 2011/0171820 A1 * | | 7/2011 | Tsau ................ H01L 21/28088 438/592 |
| 2011/0193161 A1 * | | 8/2011 | Zhu ...................... H01L 29/402 257/343 |
| 2012/0256238 A1 * | | 10/2012 | Ning ....................... H01L 21/84 257/280 |
| 2013/0087861 A1 * | | 4/2013 | Chen .................. H01L 27/0629 257/379 |
| 2013/0264640 A1 | | 10/2013 | Salman et al. |
| 2013/0267074 A1 * | | 10/2013 | Hall ......................... H01L 21/82 438/299 |
| 2014/0070315 A1 | | 3/2014 | Levy et al. |
| 2015/0357467 A1 | | 12/2015 | Jain et al. |
| 2016/0013208 A1 | | 1/2016 | Jain et al. |
| 2016/0240526 A1 | | 8/2016 | Titus |
| 2018/0069088 A1 | | 3/2018 | Jain et al. |
| 2018/0226477 A1 | | 8/2018 | Jain et al. |

OTHER PUBLICATIONS

Gupta, Tapan K., "Copper Interconnect Technology", DOI 10.1007/978-1-4419-0076-0_2, Springer Science+Business Media, LLC 2000, pp. 67-110.*
Office Action dated Nov. 4, 2015 in related U.S. Appl. No. 14/300,884, 19 pages.
Final Office Action in related U.S. Appl. No. 14/300,884 dated Apr. 21, 2016, 26 pages.
Office Action in related U.S. No. 14/864,066 dated Aug. 11, 2016, 17 pages.
Office Action in related U.S. Appl. No. 14/300,884 dated Sep. 16, 2016, 33 pages.
Office Action from U.S. Appl. No. 14/864,066 dated Dec. 27, 2016. 19 pages.
Office Action from U.S. Appl. No. 14/300,884 dated Feb. 27, 2017. 34 pages.
Office Action in related U.S. Appl. No. 14/300,884 dated Sep. 12, 2017, 23 pages.
Office Action in related U.S. Appl. No. 14/864,066 dated Aug. 10, 2017, 20 pages.
Specification and Drawings "Tunable Breakdown Voltage RF FET Devices" for U.S. Appl. No. 15/811,810, filed Nov. 14, 2017, 26 pages.
Notice of Allowance dated Mar. 27, 2018 in related U.S. Appl. No. 14/300,884, 12 pages.
Final Office Action dated Jan. 22, 2018 in related U.S. Appl. No. 14/864,066, 20 pages.
Notice of Allowance in related U.S. Appl. No. 14/300,884 dated Mar. 27, 2018, 12 pages.
Notice of Allowance in related U.S. Appl. No. 14/864,066 dated May 10, 2018, 17 pages.
Specification and Drawings for "Turnable Breakdown Voltage RF FET Devices" for related U.S. Appl. No. 15/982,370, filed May 17, 2018, 27 pages.
"List of IBM Patents or Patent Applications Treated as Related" 1 page.
Office Action dated Feb. 28, 2018 in related U.S. Appl. No. 15/811,810, 12 pages.
Specification and Drawings for "Turnable Breakdown Voltage RF FET Devices" for related U.S. Appl. No. 15/944,018, filed Apr. 3, 2018, 27 pages.
List of IBM Patents or Patent Applications Treated as Related 1 page.
Specification and Drawings for "Turnable Breakdown Voltage RF FET Devices" for related U.S. Appl. No. 16/050,230, filed Jul. 31, 2018, 26 pages.
Specification and Drawings for "Turnable Breakdown Voltage RF FET Devices" for related U.S. Appl. No. 16/031,371, filed Jul. 10, 2018, 27 pages.

(56) References Cited

OTHER PUBLICATIONS

Office Action from U.S. Appl. No. 15/944,018 dated Jun. 26, 2018. 13 pages.
Office Action from U.S. Appl. No. 15/811,810 dated Aug. 16, 2018. 19 pages.
Sarcona, Greg T., "Polysilicon Thin-Film Transistors Using Self-Aligned Cobalt and Nickel Silicide Source and Drain Contacts", IEEE Electron Device Letters, vol. 20, No. 7, Jul. 1999, pp. 332-334 (Year: 1999).
Wilk et al., "Silicon-on-insulator mesfets at the 45NM node", International Journal of High Speed Electronics and Systems, Dec. 2012, pp. 1-16.

* cited by examiner

TURNABLE BREAKDOWN VOLTAGE RF FET DEVICES

FIELD OF THE INVENTION

The invention relates to semiconductor structures and, more particularly, to tunable breakdown voltage RF MESFETs and MOSFETs and methods of manufacture.

BACKGROUND

MESFETs (metal-semiconductor field effect transistor) and HEMTs (high electron mobility transistors) are usually constructed in compound semiconductor technologies, and are faster but more expensive than silicon-based JFETs or MOSFETs (metal-oxide-semiconductor field-effect transistor). MESFETs are commonly used for microwave frequency communications and radar. For example, MESFETs/HEMTs can be used in cascode circuits for cellular power amplifier applications. However, it is increasingly difficult to use MESFETs as the basis for integrated circuits as the scale of integration increases, compared to CMOS silicon based fabrication.

MOSFETs are typically used for amplifying or switching electronic signals. MOSFETs are voltage-controlled power devices; that is, if no positive voltage is applied between gate and source the MOSFET is always non-conducting (enhancement mode MOSFET). For depletion mode MOSFET, the MOSFET is conducting even if the applied voltage between gate and source is zero. Although the MOSFET is a four-terminal device with source (S), gate (G), drain (D), and body (B) terminals, the body (or substrate) of the MOSFET is often connected to the source terminal, making it a three-terminal device like other field-effect transistors.

SUMMARY

In an aspect of the invention, a method comprises forming a first line and a second line on an underlying gate dielectric material. The second line has a width tuned to a breakdown voltage. The method further comprises forming sidewall spacers on sidewalls of the first line and the second line. The method further comprises forming source and drain regions adjacent outer edges of the first line and the second line. The method further comprises removing at least the second line to form an opening between the sidewall spacers of the second line and to expose the underlying gate dielectric material. The method further comprises depositing a layer of material on the underlying gate dielectric material within the opening. The method further comprises forming contacts to a gate structure and the source and drain regions.

In an aspect of the invention, a method comprises: forming a gate dielectric material on a substrate; forming a first line and a second line on the gate dielectric material; forming sidewall spacers on the first line and the second line, wherein the sidewall spacers between the first line and the second line define a minimum spacing, and the sidewall spacers pinch off the minimum spacing; forming source and drain regions adjacent outer edges of the first line and the second line; removing at least the second line to form an opening between the sidewall spacers of the second line and to expose the gate dielectric material; depositing a layer of material on the gate dielectric material within the opening; and forming contacts to a gate structure and the source and drain regions.

In an aspect of the invention, a structure comprises: a gate dielectric material on a substrate; a gate structure on the substrate; sidewall spacers on the gate structure and a sidewall structure remote from the gate structure forming an opening therebetween; a source region adjacent to the gate structure; a drain region remote from the gate structure and aligned with the sidewall structure; a layer of material on the gate dielectric material within the opening; and contacts to the gate structure and the source and drain regions.

In another aspect of the invention, a design structure tangibly embodied in a machine readable storage medium for designing, manufacturing, or testing an integrated circuit is provided. The design structure comprises the structures of the present invention. In further embodiments, a hardware description language (HDL) design structure encoded on a machine-readable data storage medium comprises elements that when processed in a computer-aided design system generates a machine-executable representation of the MESFETs and MOSFETs, which comprises the structures of the present invention. In still further embodiments, a method in a computer-aided design system is provided for generating a functional design model of the MESFETs and MOSFETs. The method comprises generating a functional representation of the structural elements of the MESFETs and MOSFETs.

BRIEF DESCRIPTION OF THE SEVERAL VIEWS OF THE DRAWINGS

The present invention is described in the detailed description which follows, in reference to the noted plurality of drawings by way of non-limiting examples of exemplary embodiments of the present invention.

DETAILED DESCRIPTION

The invention relates to semiconductor structures and, more particularly, to tunable breakdown voltage RF MESFETs and MOSFETs and methods of manufacture. More specifically, the present invention is directed to forming tunable breakdown voltage RF MESFETs and MOSFETs in CMOS process flows and resultant structures. The present invention is particularly useful in manufacturing high breakdown voltage MESFETs used in cascode circuits for cellular power amplifier (PA) applications, communication systems and test instruments. The methods of the present invention can also be used to manufacture other devices such as, for example, RF LDMOS (laterally diffused metal oxide semiconductor) devices or HEMTs.

Advantageously, the methods of forming the tunable breakdown voltage MESFET and/or MOSFET only use a single extra mask to define independently the gate length and gate-drain drift region. This provides circuit designers with great flexibility to tune the breakdown voltage of MESFET/MOSFET/LDMOS in a CMOS process flow in addition to the availability of on-chip CMOS/BiCMOS devices. The methods of the present invention further provide the ability to have a self-align gate to both source and drain with adjustable gate-drain spacing (drift region). The methods of the present invention also provide the ability to form a variable spacer with tight tolerances (e.g., no overlay tolerance, only edge lithography tolerance). More specifically, the present invention provides methods to form controllable spacer widths, space out source/drain regions per poly crystalline (PC) line control, i.e., providing controlled separation between gate and drain with no overlay tolerance, as well as the ability to have dual PC lines to PC line width control.

The structures of the present invention can be manufactured in a number of ways using a number of different tools. In general, though, the methodologies and tools are used to form structures with dimensions in the micrometer and nanometer scale. The methodologies, i.e., technologies, employed to manufacture the structures of the present invention have been adopted from integrated circuit (IC) technology. For example, the structures of the present invention are built on wafers and are realized in films of material patterned by photolithographic processes on the top of a wafer. In particular, the fabrication of the structures of the present invention uses three basic building blocks: (i) deposition of thin films of material on a substrate, (ii) applying a patterned mask on top of the films by photolithographic imaging, and (iii) etching the films selectively to the mask.

Figure 1:
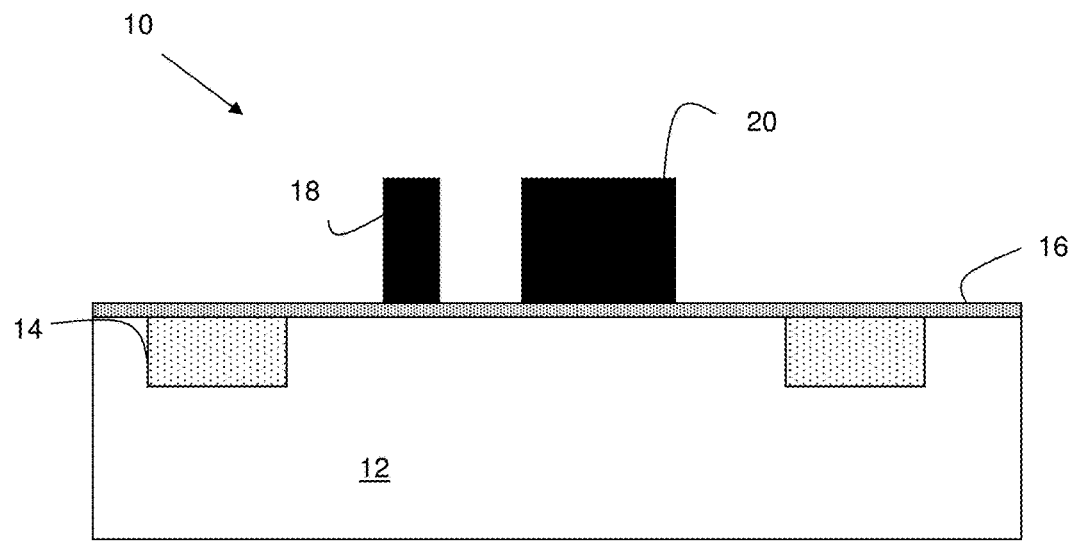
FIGS. 1-6 show processing steps and respective structures for forming MESFETs, in accordance with aspects of the present invention.

FIG. 1 shows a structure and respective processing steps in accordance with aspects of the present invention. More specifically, the structure 10 of FIG. 1 includes a substrate 12 with shallow trench isolation (STI) regions 14. In embodiments, the substrate 12 can be a BULK substrate or silicon on insulator (SOI) substrate. In any scenario, the substrate can comprise any semiconductor material such as, for example, Si, SiGe, GaAs, SiC, etc.

The STI regions 14 can be formed using conventional lithography, etching and deposition methods. For example, a resist can be formed on the substrate 12, and exposed to energy (light) to form a pattern. A reactive ion etching (RIE) with appropriate chemistry is then performed to form trenches into the substrate 12. The trenches are then filled with an insulator material, e.g., oxide, to form the STI regions 14. In embodiments, any excess insulator material on the substrate 12 can be removed using, for example, a chemical mechanical polishing (CMP) processes.

Still referring to FIG. 1, a gate dielectric material 16 is formed on the substrate 12. In embodiments, the gate dielectric material 16 can be an oxide or other gate insulator material, e.g., hafnium based materials or alumina, etc. The gate dielectric material 16 can be a thermally grown oxide, or an oxide deposited using conventional deposition methods, e.g., chemical vapor deposition (CVD) or atomic layer deposition (ALD) or Molecular Beam Epitaxy (MBE). In embodiments, the thickness of the gate dielectric material 16 can vary from about 3 Å to a few hundred angstroms; although other dimensions are also contemplated by the present invention.

Lines 18 and 20 are formed on the gate dielectric material 16, in a gate region of a device. In embodiments, the lines 18 and 20 are polycrystalline Si lines formed using conventional deposition, lithography and etching processes. For example, a polycrystalline Si is deposited on the substrate 12 using conventional CVD processes, following by a patterning step using lithography and etching processes known to those of skill in the art such that no further explanation is required for an understanding of the invention.

In embodiments, the height of the lines 18 and 20 can vary depending on the technology node, with a preferred height of about 1000 Å to 2000 Å. The widths of the lines 18 and 20 can also be tuned, e.g., adjusted, depending on the technology node, with a preferred width of the line 18 being about 10 nm to 500 nm, for a 14 nm node technology. In embodiments, the width of line 18 defines the gate length; whereas, line 20 can have a variable width for tuning breakdown voltage. The spacing between lines 18 and 20 can vary depending on spacer widths required for different technologies, e.g., ranging from about 3 nm to several hundred nanometers.

Figure 2:
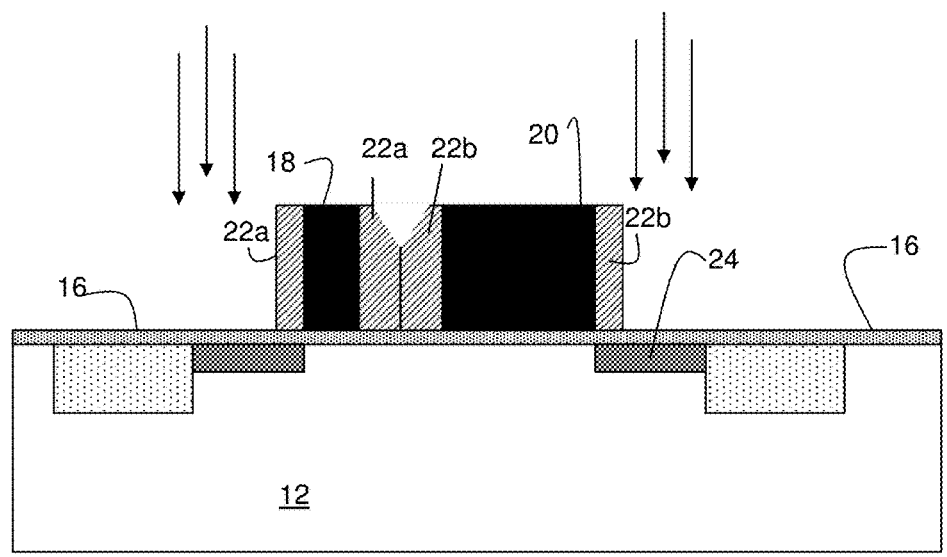

In FIG. 2, spacers 22a and 22b are formed on sides of the lines 18 and 20. In embodiments, the spacers 22a and 22b can be, for example, oxide, nitride, oxynitride, or other stacked materials. In embodiments, the spacers 22a and 22b can be formed by conventional deposition and etching processes. For example, a blanket deposition of material can be formed on the gate dielectric material 16 and lines 18 and 20. The material should be deposited to such dimensions that ensure the space between the lines 18 and 20 is pinched off, thus defining the required minimum spacing between the lines 18 and 20. The material then undergoes an anisotropic etching process to remove it from all horizontal surfaces.

Still referring to FIG. 2, source and drain regions 24 are formed using conventional ion implantation or doping processes. The source and drain regions 24 are self aligned to the lines 18 and 20, e.g., using the spacers 22a and 22b. More specifically, the source and drain regions 24 are adjacent outer edges of the first line 18 and the second line 20 and more specifically the spacers 22a and 22b formed thereon. In embodiments, reference numeral 24 can also represent conventional extension and halo implant processes. Lines 18 and 20 can also be masked using a dielectric material, e.g., oxide or nitride, to prevent the S/D or other implants from implanting the lines.

Figure 3:
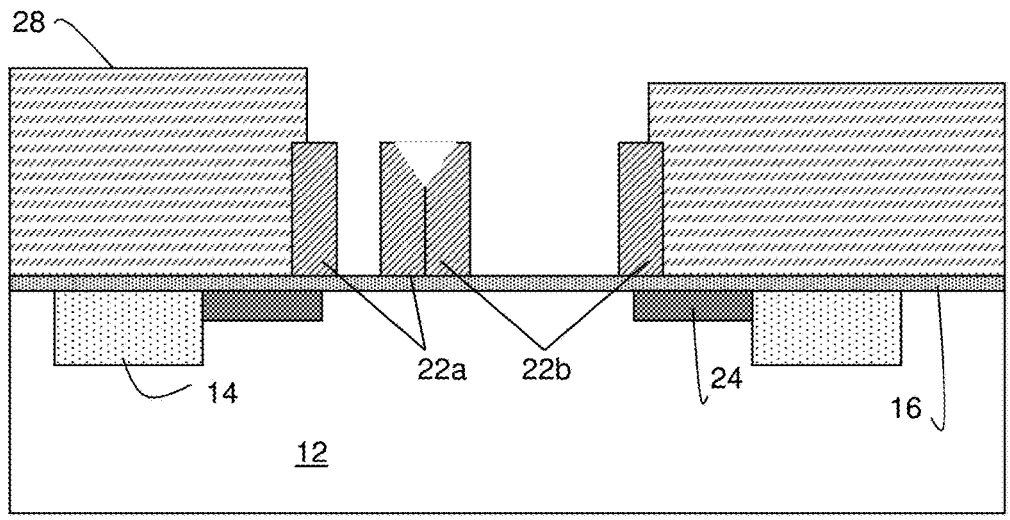

For MESFET processes, in FIG. 3, a resist 28 is formed on substrate 12, with its pattern exposing the lines 18 and 20. In embodiments, the resist boundary is formed on the outermost spacers 22a and 22b. Accordingly, the spacers 22a and 22b are designed to be sufficiently thick in order to have the resist boundary land thereon. The lines 18 and 20 are then removed using conventional etching processes, e.g., RIE or a wet etch, selective to its material.

Figure 4:
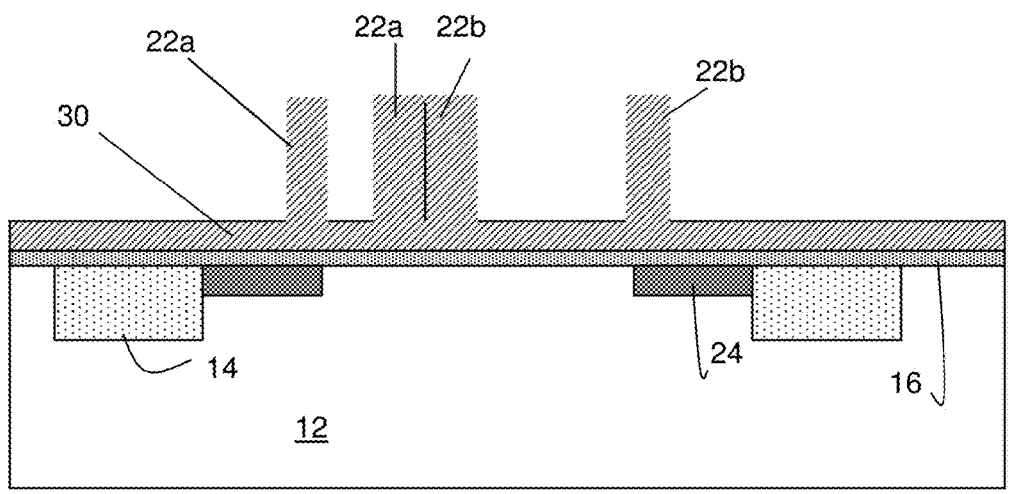

In FIG. 4, the resist is removed and a nitride layer 30 is conformally formed on the structure. More specifically, in embodiments, the resist can be removed by, for example, an oxygen ashing process or other known stripping method. The nitride layer 30 is formed by a CVD conformal deposition process over the exposed portions of the spacers 22a and 22b, and the gate dielectric material 16. In embodiments, the nitride layer 30 can be an oxynitride or other blocking material.

Figure 5:
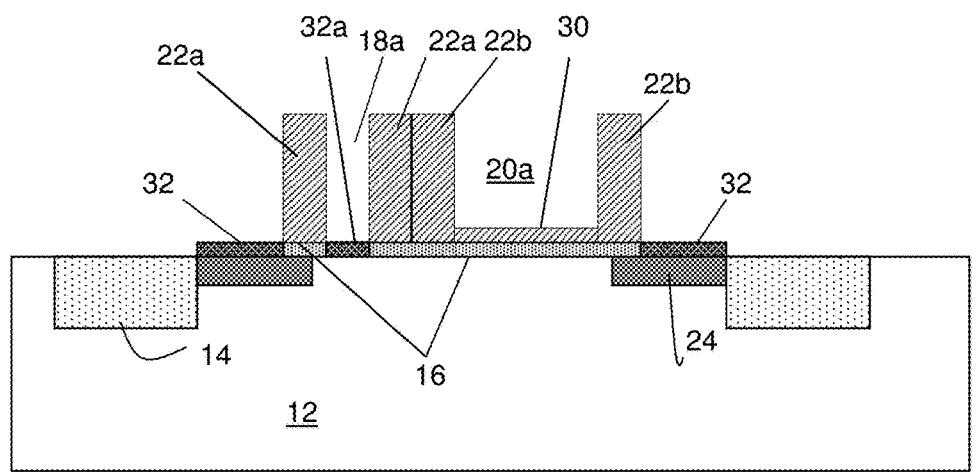

In FIG. 5, portions of the nitride layer 30 and gate dielectric material 16 are removed using conventional lithography and etching processes. For example, a resist is deposited and subsequently patterned to expose portions of the nitride layer 30 over at least the STI regions 14, source and drain regions 24 and the space 18a formed by the removal of line 18. The resist will protect all other regions including the nitride material 30 between the sidewall spacers 22b, 22b, e.g., the space 20a formed by the removal of line 20. This space can be adjusted in order to tune the voltage breakdown, for different capabilities. An etching process (RIE or wet etch) is then performed to remove the exposed nitride layer 30 and underlying gate dielectric material 16. In embodiments, two different etching processes with different chemistries can be performed to remove these separate materials, e.g., nitride layer 30 and gate dielectric material 16. The resist can then be removed by conventional processes as described herein.

Still referring to FIG. 5, silicide regions 32 are formed in contact with the source and drain regions 24. Also, a silicide region is formed as the gate structure 32a for a MESFET. As shown in FIG. 5, the gate structure 32a is spaced away (e.g., remote) from the source region 24 to prevent shorting. In embodiments, the silicide regions 32 and gate structure 32a are formed by deposition of a metal and a subsequent annealing process. In embodiments, the metal material can be, for example, titanium, cobalt, nickel, platinum or other known metals or metal alloys or combinations thereof. The metal material can be deposited to a thickness of about 300 Å to about 1000 Å; although other dimensions are also contemplated by the present invention. The anneal process can be a conventional anneal, e.g., ranging from a few seconds to a several minutes at temperatures of about 300° C. to 1000° C. As should be understood by those of skill in the art, the source and drain regions 24 are both self-aligned to the gate 32a, and drain to gate distance (e.g., space 20a) can be tuned based on the width of the line 20 which is removed in subsequent processing steps.

Figure 6:
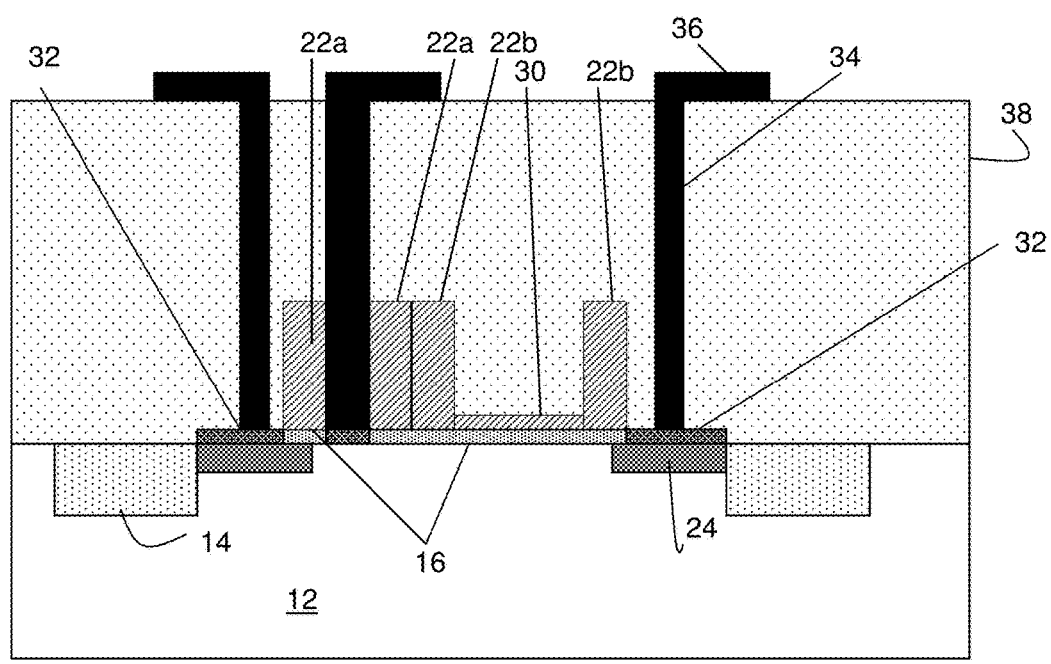

FIG. 6 shows further processing steps and a respective structure in accordance with aspects of the present invention. In particular, in FIG. 6, contacts 34 and wiring structures 36 are formed in direct electrical contact with the silicide regions 32 and gate structure 32a. The contacts 34 and wiring structures 36 are formed by conventional CMOS processes. For example, interlevel dielectric material (ILD) 38 is deposited and patterned using conventional lithography and etching (RIE) processes. The ILD 38 can be back end of the line (BEOL) materials such as Borophosphosilicate glass (BSPG) or undoped silicate glass (USG). After via formation, metal material e.g., copper or aluminum, is deposited in the vias and any excess material is removed from a surface of the ILD 38 using, e.g., CMP processes. The wiring structure 36 can then be formed by a deposition and patterning processes.

Figure 7:
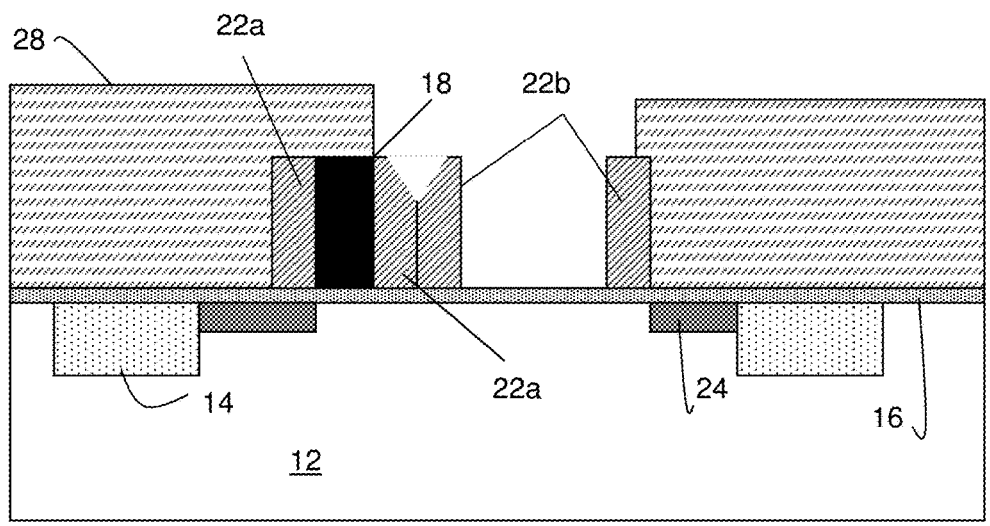
FIGS. 7-10 show processing steps and respective structures for forming MOSFETs, in accordance with aspects of the present invention.

FIGS. 7-10 show processing steps and respective structures for the formation of a MOSFET in accordance with aspects of the present invention. Referring to FIG. 7, a resist 28 is formed on substrate 12, with its pattern exposing line 20 (shown in FIG. 2). In embodiments, the resist boundary covers the line 18 and the outermost spacer 22b, thereby protecting the line 18 during etching processes. The line 20 is then removed using conventional etching processes, e.g., RIE or wet etch, selective to its material. Line 18 and the underlying gate dielectric material 16 will form a gate structure.

Figure 8:
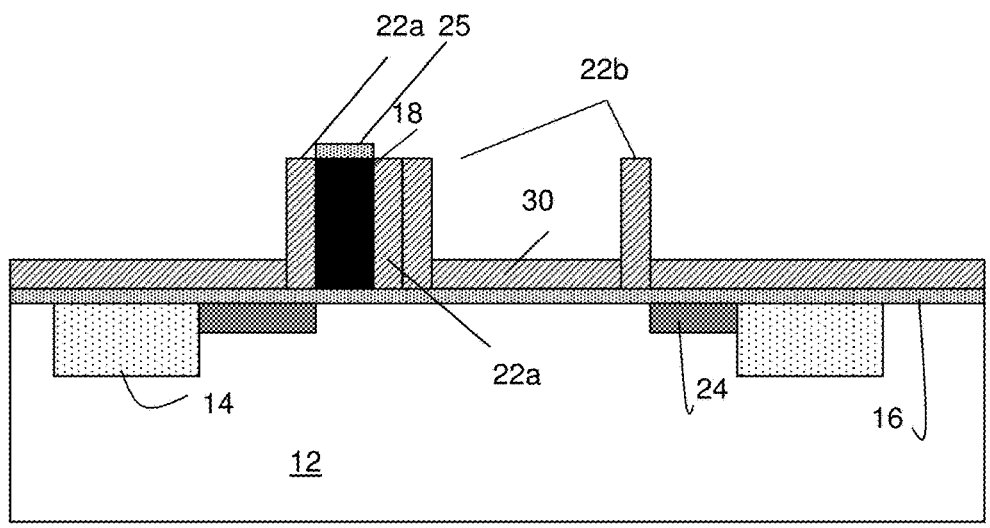

In FIG. 8, the resist is removed and a nitride layer 30 is conformally formed on the structure and a dielectric layer 25 is also over line 18. More specifically, in embodiments, the resist can be removed by, for example, an oxygen ashing process or other known stripping method. The nitride layer 30 is formed by a CVD conformal deposition process over the exposed portions of the spacers 22a and 22b, and the gate dielectric material 16. In embodiments, the nitride layer 30 can be an oxynitride or other blocking material.

Figure 9:
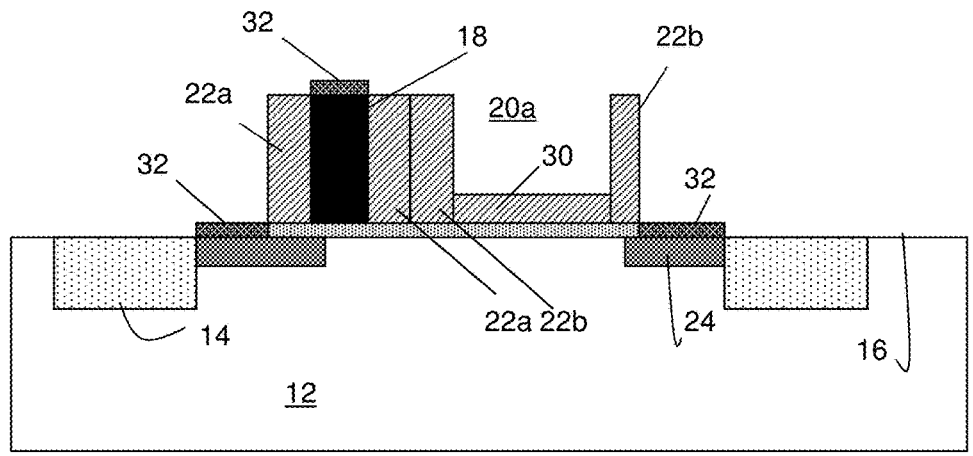

In FIG. 9, portions of the nitride layer 30 and gate dielectric material 16 are removed on the horizontal surfaces using conventional lithography and etching processes. For example, a resist is deposited and subsequently patterned to expose portions of the nitride layer 30 over at least the STI regions 14, source and drain regions 24 and the line 18. The resist will protect all other regions including the nitride material 30 between the sidewall spacers 22b, 22b, e.g., the space 20a formed by the removal of line 20. An etching process (RIE) is then performed to remove the exposed portions of the nitride layer 30 and underlying gate dielectric material 16. In embodiments, two different etching processes with different chemistries can be performed to remove these separate materials, e.g., nitride layer 30 and gate dielectric material 16. The resist can then be removed by conventional processes as described herein.

Still referring to FIG. 9, silicide regions 32 are formed in contact with the source and drain regions 24 and line (gate structure) 18. In embodiments, the silicide regions 32 are formed by deposition of a metal and a subsequent annealing process. In embodiments, the metal material can be, for example, titanium, cobalt, nickel, platinum or other known metals or metal alloys or combinations thereof. The metal material can be deposited to a thickness of about 300 Å to about 1000 Å; although other dimensions are also contemplated by the present invention. The anneal process can be a conventional anneal, e.g., ranging from a few seconds to a several minutes at temperatures of about 300° C. to 1000° C. As should be understood by those of skill in the art, the source and drain regions 24 are both self-aligned to the gate 32a, and drain to gate distance (e.g., space 20a) can be tuned based on the width of the line 20 which is removed in subsequent processing steps.

Figure 10:
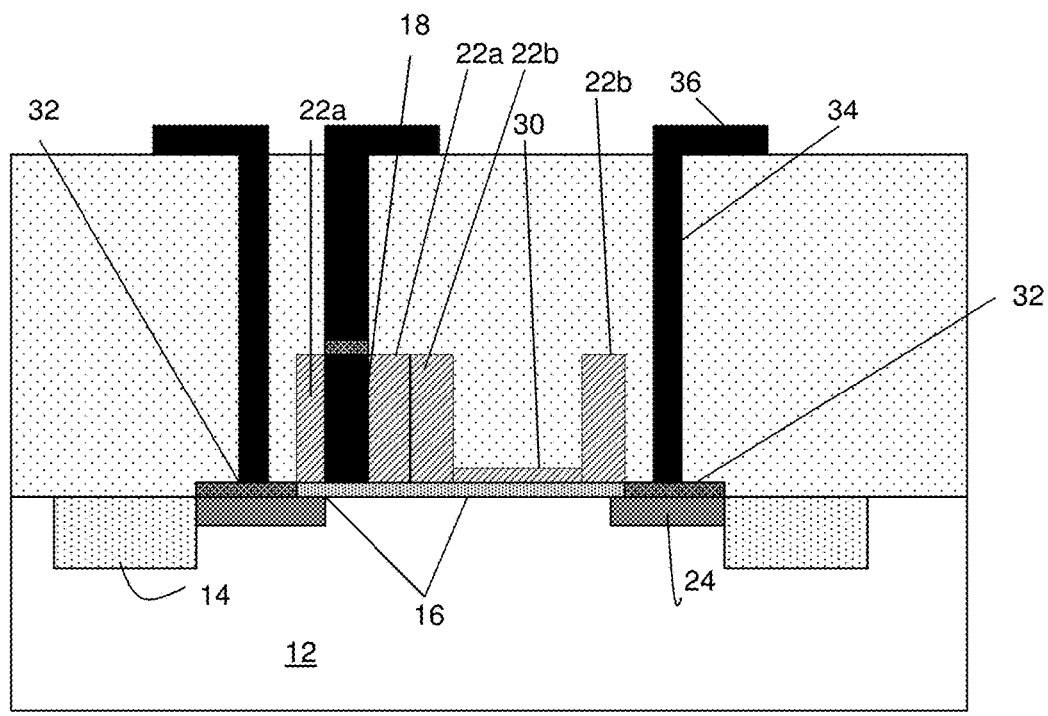

In FIG. 10, contacts 34 and wiring structures 36 are formed in direct electrical contact with the silicide regions 32. The contacts 34 and wiring structures 36 are formed by conventional CMOS processes as already described herein.

Figure 11:
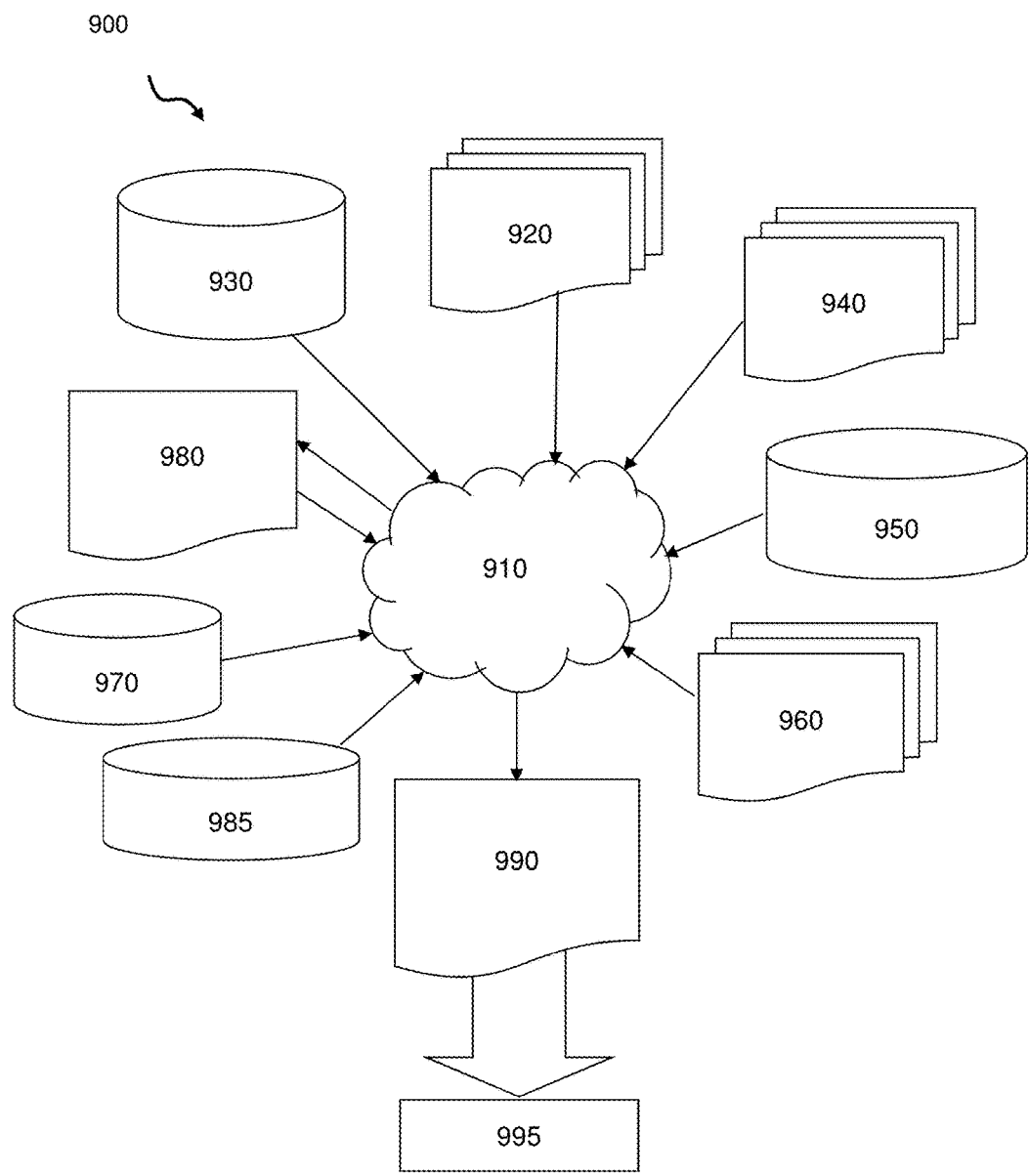
FIG. 11 is a flow diagram of a design process used in semiconductor design, manufacture, and/or test.

FIG. 11 is a flow diagram of a design process used in semiconductor design, manufacture, and/or test. FIG. 11 shows a block diagram of an exemplary design flow 900 used for example, in semiconductor IC logic design, simulation, test, layout, and manufacture. Design flow 900 includes processes, machines and/or mechanisms for processing design structures or devices to generate logically or otherwise functionally equivalent representations of the design structures and/or devices described above and shown in FIGS. 1-10. The design structures processed and/or generated by design flow 900 may be encoded on machine-readable transmission or storage media to include data and/or instructions that when executed or otherwise processed on a data processing system generate a logically, structurally, mechanically, or otherwise functionally equivalent representation of hardware components, circuits, devices, or systems. Machines include, but are not limited to, any machine used in an IC design process, such as designing, manufacturing, or simulating a circuit, component, device, or system. For example, machines may include: lithography machines, machines and/or equipment for generating masks (e.g. e-beam writers), computers or equipment for simulating design structures, any apparatus used in the manufacturing or test process, or any machines for programming functionally equivalent representations of the design structures into any medium (e.g. a machine for programming a programmable gate array).

Design flow 900 may vary depending on the type of representation being designed. For example, a design flow 900 for building an application specific IC (ASIC) may differ from a design flow 900 for designing a standard component or from a design flow 900 for instantiating the design into a programmable array, for example a programmable gate array (PGA) or a field programmable gate array (FPGA) offered by Altera® Inc. or Xilinx® Inc.

FIG. 11 illustrates multiple such design structures including an input design structure 920 that is preferably processed by a design process 910. Design structure 920 may be a logical simulation design structure generated and processed by design process 910 to produce a logically equivalent functional representation of a hardware device. Design structure 920 may also or alternatively comprise data and/or program instructions that when processed by design process 910, generate a functional representation of the physical structure of a hardware device. Whether representing functional and/or structural design features, design structure 920 may be generated using electronic computer-aided design (ECAD) such as implemented by a core developer/designer. When encoded on a machine-readable data transmission, gate array, or storage medium, design structure 920 may be accessed and processed by one or more hardware and/or software modules within design process 910 to simulate or otherwise functionally represent an electronic component, circuit, electronic or logic module, apparatus, device, or system such as those shown in FIGS. 1-10. As such, design structure 920 may comprise files or other data structures including human and/or machine-readable source code, compiled structures, and computer-executable code structures that when processed by a design or simulation data processing system, functionally simulate or otherwise represent circuits or other levels of hardware logic design. Such data structures may include hardware-description language (HDL) design entities or other data structures conforming to and/or compatible with lower-level HDL design languages such as Verilog and VHDL, and/or higher level design languages such as C or C++.

Design process 910 preferably employs and incorporates hardware and/or software modules for synthesizing, translating, or otherwise processing a design/simulation functional equivalent of the components, circuits, devices, or logic structures shown in FIGS. 1-10 to generate a netlist 980 which may contain design structures such as design structure 920. Netlist 980 may comprise, for example, compiled or otherwise processed data structures representing a list of wires, discrete components, logic gates, control circuits, I/O devices, models, etc. that describes the connections to other elements and circuits in an integrated circuit design. Netlist 980 may be synthesized using an iterative process in which netlist 980 is resynthesized one or more times depending on design specifications and parameters for the device. As with other design structure types described herein, netlist 980 may be recorded on a machine-readable data storage medium or programmed into a programmable gate array. The medium may be a non-volatile storage medium such as a magnetic or optical disk drive, a programmable gate array, a compact flash, or other flash memory. Additionally, or in the alternative, the medium may be a system or cache memory, buffer space, or electrically or optically conductive devices and materials on which data packets may be transmitted and intermediately stored via the Internet, or other networking suitable means.

Design process 910 may include hardware and software modules for processing a variety of input data structure types including netlist 980. Such data structure types may reside, for example, within library elements 930 and include a set of commonly used elements, circuits, and devices, including models, layouts, and symbolic representations, for a given manufacturing technology (e.g., different technology nodes, 32 nm, 45 nm, 90 nm, etc.). The data structure types may further include design specifications 940, characterization data 950, verification data 960, design rules 970, and test data files 985 which may include input test patterns, output test results, and other testing information. Design process 910 may further include, for example, standard mechanical design processes such as stress analysis, thermal analysis, mechanical event simulation, process simulation for operations such as casting, molding, and die press forming, etc. One of ordinary skill in the art of mechanical design can appreciate the extent of possible mechanical design tools and applications used in design process 910 without deviating from the scope and spirit of the invention. Design process 910 may also include modules for performing standard circuit design processes such as timing analysis, verification, design rule checking, place and route operations, etc.

Design process 910 employs and incorporates logic and physical design tools such as HDL compilers and simulation model build tools to process design structure 920 together with some or all of the depicted supporting data structures along with any additional mechanical design or data (if applicable), to generate a second design structure 990.

Design structure 990 resides on a storage medium or programmable gate array in a data format used for the exchange of data of mechanical devices and structures (e.g. information stored in a IGES, DXF, Parasolid XT, JT, DRG, or any other suitable format for storing or rendering such mechanical design structures). Similar to design structure 920, design structure 990 preferably comprises one or more files, data structures, or other computer-encoded data or instructions that reside on transmission or data storage media and that when processed by an ECAD system generate a logically or otherwise functionally equivalent form of one or more of the embodiments of the invention shown in FIGS. 1-10. In one embodiment, design structure 990 may comprise a compiled, executable HDL simulation model that functionally simulates the devices shown in FIGS. 1-10.

Design structure 990 may also employ a data format used for the exchange of layout data of integrated circuits and/or symbolic data format (e.g. information stored in a GDSII (GDS2), GL1, OASIS, map files, or any other suitable format for storing such design data structures). Design structure 990 may comprise information such as, for example, symbolic data, map files, test data files, design content files, manufacturing data, layout parameters, wires, levels of metal, vias, shapes, data for routing through the manufacturing line, and any other data required by a manufacturer or other designer/developer to produce a device or structure as described above and shown in FIGS. 1-10. Design structure 990 may then proceed to a stage 995 where, for example, design structure 990: proceeds to tape-out, is released to manufacturing, is released to a mask house, is sent to another design house, is sent back to the customer, etc.

The method(s) as described above is used in the fabrication of integrated circuit chips. The resulting integrated circuit chips can be distributed by the fabricator in raw wafer form (that is, as a single wafer that has multiple unpackaged chips), as a bare die, or in a packaged form. In the latter case the chip is mounted in a single chip package (such as a plastic carrier, with leads that are affixed to a motherboard or other higher level carrier) or in a multichip package (such as a ceramic carrier that has either or both surface interconnections or buried interconnections). In any case the chip is then integrated with other chips, discrete circuit elements, and/or other signal processing devices as part of either (a) an intermediate product, such as a motherboard, or (b) an end product. The end product can be any product that includes integrated circuit chips, ranging from toys and other low-end applications to advanced computer products having a display, a keyboard or other input device, and a central processor.

The descriptions of the various embodiments of the present invention have been presented for purposes of illustration, but are not intended to be exhaustive or limited to the embodiments disclosed. Many modifications and variations will be apparent to those of ordinary skill in the art without departing from the scope and spirit of the described embodiments. The terminology used herein was chosen to best explain the principles of the embodiments, the practical application or technical improvement over technologies found in the marketplace, or to enable others of ordinary skill in the art to understand the embodiments disclosed herein.

What is claimed is:

1. A method, comprising:
   forming a first line and a second line on an underlying gate dielectric material formed on a substrate, wherein the first line and the second line are spaced apart;
   forming sidewall spacers on sidewalls of the first line and the second line;
   forming a source region and a drain region in the substrate and adjacent to outer edges of the first line and the second line;
   removing the second line to form an opening between the sidewall spacers of the second line and to expose the underlying gate dielectric material;
   depositing a layer of insulator material on the underlying gate dielectric material within the opening;
   forming contacts to a gate structure and the source and drain regions; and
   forming silicide regions on the source region, the drain region and the gate structure, prior to forming the contacts, wherein:
      a channel region extends between the source region and the drain region;
      the forming of the first line and the second line comprises a blanket deposition of a semiconductor material followed by a patterning process;
      the underlying gate dielectric material extends from an outer edge of a sidewall of the first line to an outer edge of a sidewall of the second line;
      the first line and the underlying gate dielectric material form the gate structure; and
      the removing of the second line comprises protecting the first line with a resist material while etching of the second line.

2. The method of claim 1, wherein the sidewall spacers comprise sidewall material formed directly on the first line, the second line and on an upper surface of the underlying gate dielectric material including between the first line and the second line.

3. The method of claim 2, wherein the removing the second line to form the opening is provided after forming the underlying gate dielectric material.

4. The method of claim 3, wherein the first line is the gate structure formed on the underlying gate dielectric material which is deposited on an underlying substrate prior to forming the contacts.

5. The method of claim 4, wherein the layer of material on the underlying dielectric material is a deposited after forming of the first line.

6. The method of claim 5, wherein the source and drain regions are self aligned.

7. A method, comprising:
   forming a gate dielectric material on a substrate;
   forming a first line and a second line on the gate dielectric material;
   forming sidewall spacers on the first line and the second line, wherein the sidewall spacers between the first line and the second line define a minimum spacing, and the sidewall spacers fill the minimum spacing;
   forming source and drain regions adjacent outer edges of the first line and the second line;
   removing the second line to form an opening between the sidewall spacers of the second line and to expose the gate dielectric material;
   depositing a layer of nitride material on the gate dielectric material within the opening; and
   forming contacts to a gate structure and the source and drain regions, wherein:
      the forming of the first line and the second line comprises a blanket deposition of polycrystalline followed by a patterning process;
      the gate dielectric material extends from an outer edge of a sidewall of the first line to an outer edge of a sidewall of the second line;
      the first line and the gate dielectric material form a gate structure;
      silicide regions are formed on the source region, the drain region, and the gate structure prior to forming the contacts, wherein the silicide regions of the source and drain regions are formed on a same surface of the substrate as the gate dielectric material, prior to forming the contacts for the contacts to contact the silicide region on the source and drain regions; and
      the removing of the second line comprising protecting the first line with a resist material while etching of the second line.

8. A method, comprising:
   forming a first line and a second line on an underlying gate dielectric material formed on a substrate;
   forming sidewall spacers on sidewalls of the first line and the second line;
   forming source and drain regions in the substrate and adjacent to outer edges of the first line and the second line;
   removing the second line to form an opening between the sidewall spacers of the second line and to expose the underlying gate dielectric material;
   depositing a layer of nitride material on the underlying gate dielectric material within the opening;
   forming contacts to a gate structure and the source and drain regions; and
   forming silicide regions on the source region, the drain region, and the gate structure, prior to forming the contacts; wherein:
   a channel region extends between the source and drain regions;
   the forming of the first line and the second line comprises a blanket deposition of a semiconductor material followed by a patterning process;
   the first line and the underlying gate dielectric material form the gate structure;
   the removing of the second line comprises protecting the first line with a resist material while etching of the second line;
   the sidewall spacers comprise sidewall material formed directly on the first line, the second line and on an upper surface of the underlying gate dielectric material including between the first line and the second line;
   the removing the second line to opening is provided after forming the underlying gate dielectric material;
   the first line is the gate structure formed on the underlying gate dielectric material which is deposited on an underlying substrate prior to forming the contact;
   the layer of material on the gate dielectric material is a deposited after forming of the first line;
   the source and drain regions are self aligned; and a gate structure to drain distance is tuned based on a width of the second line.

9. The method of claim 8, wherein the sidewall spacers are formed directly on top of the underlying gate dielectric material.

10. The method of claim 9, wherein one of the sidewall spacers and a first sidewall structure are contacting one another and provided directly on top of the underlying gate dielectric material.

11. The method of claim 10, wherein a second sidewall structure is remote from the first sidewall structure and provided directly on top of the underlying gate dielectric.

\* \* \* \* \*